United States Patent
Hsu

(10) Patent No.: US 10,444,783 B2
(45) Date of Patent: Oct. 15, 2019

(54) VOLTAGE-TO-CURRENT CIRCUIT AND VOLTAGE-CONTROLLED OSCILLATOR APPARATUS

(71) Applicant: PixArt Imaging Inc., Hsin-Chu (TW)

(72) Inventor: Cheng-Seng Hsu, Hsin-Chu (TW)

(73) Assignee: PixArt Imaging Inc., Hsin-Chu (TW)

( * ) Notice: Subject to any disclaimer, the term of this patent is extended or adjusted under 35 U.S.C. 154(b) by 224 days.

(21) Appl. No.: 15/597,136

(22) Filed: May 16, 2017

(65) Prior Publication Data
US 2018/0175793 A1 Jun. 21, 2018

(30) Foreign Application Priority Data
Dec. 20, 2016 (TW) .............................. 105142222 A

(51) Int. Cl.
*G04C 21/36* (2006.01)
*H03B 5/36* (2006.01)
*H03K 3/03* (2006.01)
*G05F 3/26* (2006.01)

(52) U.S. Cl.
CPC ...... *G05F 3/267* (2013.01); *H03B 2200/0038* (2013.01)

(58) Field of Classification Search
CPC .................. G05F 3/267; H03B 2200/0038
USPC ................ 331/108 A, 182, 183, 185, 186
See application file for complete search history.

*Primary Examiner* — Richard Tan
(74) *Attorney, Agent, or Firm* — Winston Hsu

(57) ABSTRACT

A voltage-to-current circuit employs low leakage manufacturing process transistor(s) to connect at least one non-controlled terminal (e.g. source, drain, or base of MOSFET) and/or control terminal (e.g. gate of MOSFET) of a low power manufacturing process transistor to a predetermined level such as ground level or power supply voltage level when turning off the low power manufacturing process transistor, so as to connect at least two terminals of the low power manufacturing process transistor to the same voltage level, for avoiding or reducing leakage current of the low power manufacturing process transistor when it is turned off.

8 Claims, 7 Drawing Sheets

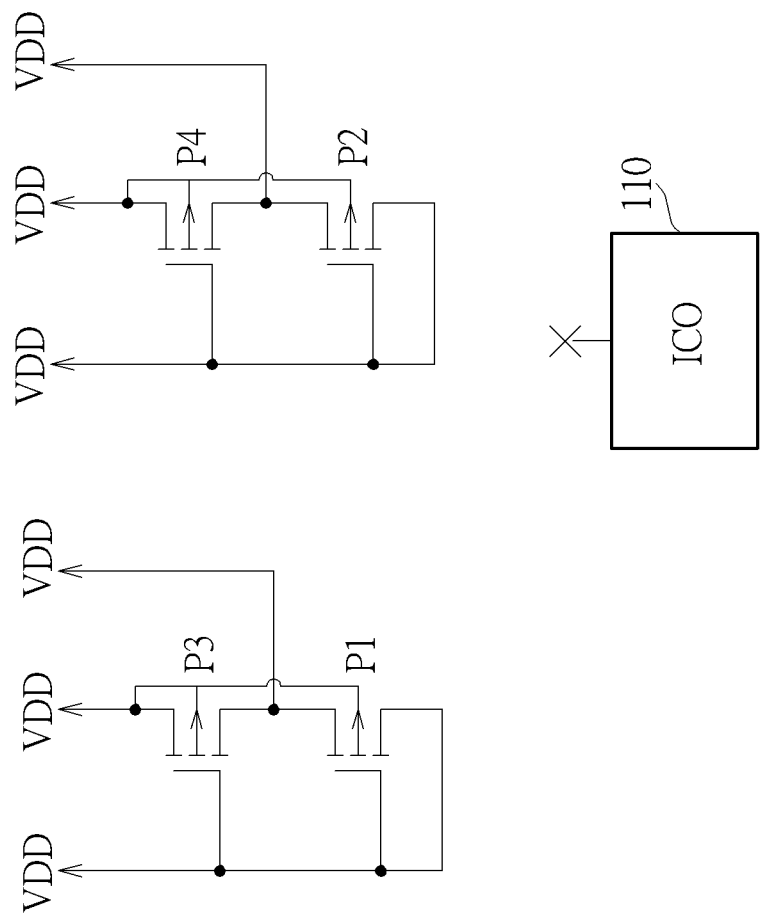

VOLTAGE-TO-CURRENT CIRCUIT AND VOLTAGE-CONTROLLED OSCILLATOR APPARATUS

BACKGROUND OF THE INVENTION

1. Field of the Invention

The invention relates to a voltage-to-current mechanism, and more particularly to a voltage-to-current circuit and a voltage-controlled oscillator apparatus.

2. Description of the Prior Art

Generally speaking, designing a circuit chip such as a phase-locked loop chip to operate under a condition of low supply voltage level for saving more power has become the main trend of today's electronic device. In addition, with the progress and evolution of manufacturing processes, when designing the circuit chip, the conventional mechanism is to adopt transistor element(s) having a low threshold voltage to implement the circuit chip for achieving a wider voltage operation range. However, it is inevitable that larger leakage currents are generated once a transistor element having the low threshold voltage is turned off.

SUMMARY OF THE INVENTION

Therefore, one of the objectives of the invention is to provide a voltage-to-current circuit and a voltage-controlled oscillator apparatus which can include both the characteristics of low power manufacturing process and low leakage manufacturing process, to solve the problems mentioned above.

According to the embodiments, a voltage-to-current circuit is disclosed. The voltage-to-current circuit is used for converting an input voltage signal to an output current signal in proportion and outputting the output current signal to a current control oscillator. The voltage-to-current circuit comprises a switching transistor, a working transistor, a current mirror circuit, at least one low leakage manufacturing process transistor. The switching transistor is turned on when the voltage-to-current circuit is activated. The working transistor has a control terminal, a first terminal, and a second terminal wherein the control terminal is coupled to the input voltage signal to receive the input voltage signal, the first terminal is coupled to a ground level, and the second terminal is coupled to one terminal of the switching transistor; the input voltage signal determines a conductance of the working transistor and is used for generating an output at the second terminal of the working transistor. The current mirror circuit including a pair of transistors at least and is coupled to a supply voltage level and another terminal of the switching transistor, and is configured for generating the output current signal according to the output at the second terminal of the working transistor. The at least one low leakage manufacturing process transistor is coupled to the control terminal and the second terminal of the working transistor. The working transistor and the current mirror circuit correspond to a first threshold voltage of a low power manufacturing process while the switching transistor and the at least one low leakage manufacturing process transistor correspond to a second threshold voltage of a low leakage manufacturing process. The second threshold voltage is higher than the first threshold voltage. When the voltage-to-current circuit is disabled, the switching transistor is turned off to be at open-circuit state, and the at least one low leakage manufacturing process transistor is turned on, to make the control terminal and the second terminal of the working transistor be coupled to the ground level.

According to the embodiments, a voltage-to-current circuit is disclosed. The voltage-to-current circuit is configured for converting an input voltage signal into an output current signal in proportion and outputting the output current signal to a current controlled oscillator. The voltage-to-current circuit comprises a switching transistor, a working transistor, a current mirror circuit, and at least one low leakage manufacturing process transistor. The switching transistor is turned on when the voltage-to-current circuit is activated. The working transistor has a control terminal, a first terminal, and a second terminal wherein the control terminal is coupled to the input voltage signal to receive the input voltage signal, the first terminal is coupled to a ground level, and the second terminal is coupled to one terminal of the switching transistor. The input voltage signal determines a conductance of the working transistor and is used for generating an output at the second terminal of the working transistor. The current mirror circuit comprises a pair of transistors at least, and is coupled to a supply voltage level and another terminal of the switching transistor, and is configured for generating the output current signal according to the output at the second terminal of the working transistor. The at least one low leakage manufacturing process transistor is coupled to at least one non-control terminal of at least one of the pair of transistors of the current mirror circuit. The working transistor and the current mirror circuit both correspond to a first threshold voltage of a low power manufacturing process while the switching transistor and the at least one low leakage manufacturing process transistor both correspond to a second threshold voltage of a low leakage manufacturing process, and the second threshold voltage is higher than the first threshold voltage. When the voltage-to-current circuit is disabled, the switching transistor is turned off to be at open-circuit state, and the at least one low leakage manufacturing process transistor is turned on, to couple a plurality of non-control terminals of at least one of the pair of transistors of the current mirror circuit to the supply voltage level.

According to the embodiments, a voltage-controlled oscillator apparatus is disclosed. The apparatus comprises a current-controlled oscillator and a voltage-to-current circuit. The current-controlled oscillator is configured for generating an output frequency signal according to a current signal. The voltage-to-current circuit is configured for converting an input voltage signal into a current signal in proportion and outputting the current signal to the current-controlled oscillator. The voltage-to-current circuit comprises a switching transistor, a working transistor, a current mirror circuit, and at least one low leakage manufacturing process transistor. The switching transistor is turned on when the voltage-to-current circuit is enabled. The working transistor includes a control terminal, a first terminal, and a second terminal wherein the control terminal is coupled to the input voltage signal to receive the input voltage signal, the first terminal is coupled to a ground level, and the second terminal is coupled to one terminal of the switching transistor. The input voltage signal determines a conductance of the working transistor to generate an output at the second terminal of the working transistor. The current mirror circuit comprises a pair of transistors at least and is coupled to a supply voltage level and another terminal of the switching transistor and used for generating the output current signal according to the output at the second terminal of the working transistor. The at least one low leakage manufacturing process transistor is coupled to the control terminal and the second terminal of the working transistor. The working transistor and the current mirror circuit both correspond to a first threshold voltage of a low power manufacturing process while the switching transistor and the at least one low leakage manufacturing process transistor both correspond to a second threshold voltage of a low leakage manufacturing process, and the second threshold voltage is higher than the first threshold voltage. When the voltage-to-current circuit is disabled, the switching transistor is turned off to be at open-circuit state, and the at least one low leakage manufacturing process transistor is turned on, to couple the control terminal the second terminal of the working transistor to the ground level.

According to the embodiments, a voltage-controlled oscillator apparatus is disclosed. The apparatus comprises a current-controlled oscillator and a voltage-to-current circuit. The current-controlled oscillator is configured for generating an output frequency signal according to a current signal. The voltage-to-current circuit is configured for converting an input voltage signal into a current signal in proportion and outputting the current signal to the current-controlled oscillator. The voltage-to-current circuit comprises a switching transistor, a working transistor, a current mirror circuit, and at least one low leakage manufacturing process transistor. The switching transistor is turned on when the voltage-to-current circuit is enabled. The working transistor has a control terminal, a first terminal, and a second terminal wherein the control terminal is coupled to the input voltage signal to receive the input voltage signal, the first terminal is coupled to a ground level, and the second terminal is coupled to a terminal of the switching transistor. The input voltage signal determines a conductance of the working transistor to generate an output at the second terminal of the working transistor. The current mirror circuit comprises a pair of transistors at least and is coupled to a supply voltage level and another terminal of the switching transistor and is configured for generating the output current signal according to the output at the second terminal of the working transistor. The at least one low leakage manufacturing process transistor is coupled to at least one non-control terminal of at least one of the pair of transistors of the current mirror circuit. The working transistor and the current mirror circuit both correspond to a first threshold voltage of a low power manufacturing process while the switching transistor and the at least one low leakage manufacturing process transistor both correspond to a second threshold voltage of a low leakage manufacturing process, and the second threshold voltage is higher than the first threshold voltage. When the voltage-to-current circuit is disabled, the switching transistor is turned off to be at open-circuit state, and the at least one low leakage manufacturing process transistor is turned on, to couple a plurality of non-control terminals of at least one of the pair of transistors of the current mirror circuit tot the supply voltage level.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4B is an equivalent circuit diagram of the voltage-to-current circuit as shown in FIG. 4A when turning off each low power manufacturing process transistor.

DETAILED DESCRIPTION

To provide the advantage of low power consumption when circuit element(s) of voltage-to-current operation is/are enabled and the advantage of low leakage currents when the circuit element(s) is/are disabled, working transistor(s), transistor(s) within a current mirror circuit, and/or transistor(s) for providing a bias current in a voltage-to-current circuit in embodiments of the invention is/are implemented by adopting low power manufacturing process transistor(s) which correspond(s) to a lower first threshold voltage VTH1. Also, at least one transistor element, which is used for avoiding or alleviating the leakage currents generated due to disabling the low power manufacturing process transistor(s), is implemented by adopting a low leakage manufacturing process transistor that corresponds to a higher second threshold voltage VTH2. Accordingly, the transistors of the voltage-to-current circuit mentioned above can equivalently include both of the advantages of low power consumption and low leakage currents. Actually, the leakage currents generated due to a low power manufacturing process transistor when turned off may be usually at least ten or hundred times than those generated due to a low leakage manufacturing process transistor when turned off. Additionally, the threshold voltage of a low leakage manufacturing process transistor may be much higher than that of a low power manufacturing process transistor; for an example of 90 nm manufacturing process, the threshold voltage of a low leakage manufacturing process transistor may be at a range of 0.5-0.6 Volts, and the threshold voltage of a low power manufacturing process transistor may be at a range of 0.2-0.3 Volts. It should be noted that the difference of threshold voltages in this example is merely used for illustrative purposes, and is not meant to be a limitation of the invention.

Further, for a current mirror circuit implemented with a cascode current mirror circuit structure, low power manufacturing process transistor(s) can be utilized to implement the cascode current mirror circuit structure so as to provide the advantages of wider voltage operation range and avoiding transistor(s) enter the linear region.

In the under-mentioned embodiments of the invention, a voltage-controlled oscillator apparatus of a phase-locked loop is provided as an example for illustrative purposes. However, this is not meant to be a limitation. The under-mentioned voltage-to-current circuit(s) can be applied to other different type or application circuits configured to operate under the condition of low supply voltage level. Therefore, the under-mentioned voltage-to-current circuit(s) in the embodiments can be used with a current-controlled oscillator but this example is not a limitation of the invention.

Figure 1A:
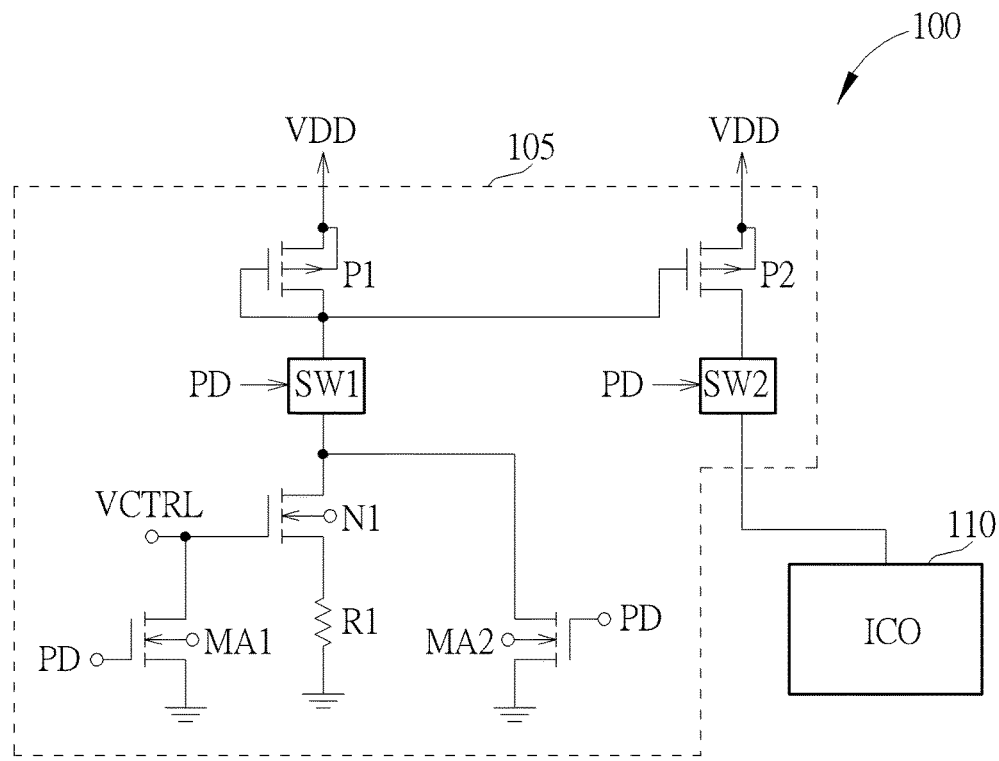
FIG. 1A is a diagram of a voltage-to-current circuit of a voltage-controlled oscillator apparatus according to a first embodiment of the invention.

Refer to FIG. 1A, which is a diagram of a voltage-to-current circuit 105 of a voltage-controlled oscillator apparatus 100 according to a first embodiment of the invention. The voltage-controlled oscillator apparatus 100 comprises a voltage-to-current (V2I) circuit 105 and a current-controlled oscillator (ICO) 110. The voltage-to-current circuit 105 comprises switching transistors SW1-SW2 used as switches, a working transistor N1, a current mirror circuit comprising one pair of transistors P1-P2 at least, at least one of first transistors MA1 and MA2, and a resistor R1. The voltage-to-current circuit 105 is arranged for converting an input voltage signal VCTRL in proportion to generate an output current signal to the current-controlled oscillator 110. The output current signal passes through the switching transistor SW2 to the current-controlled oscillator 110 so that the current-controlled oscillator 110 can generate and output an oscillation frequency signal.

In practice, the supply voltage level VDD is a low voltage level such as one Volt. Different transistors within the voltage-to-current circuit 105 are implemented by adopting different manufacturing processes to obtain a wider operating voltage range when the voltage-to-current circuit 105 is operated under the condition of low supply voltage level and also to avoid the transistors enter an undesired operating region. For example, this can avoid a MOS transistor enter a linear operating region. In this embodiment, the working transistor N1 and the transistors P1-P2 of the current mirror circuit are implemented by using transistors of a low power manufacturing process and correspond to a first threshold voltage VTH1 which is a lower threshold voltage. The switching transistors SW1-SW2 and the at least one of first transistors MA1 and MA2 are adopted for avoiding or alleviating leakage current(s) of transistors when the voltage-to-current circuit 105 is disabled, and are implemented by using transistors of a low leakage manufacturing process and correspond to the second threshold voltage VTH2 which is higher than the first threshold voltage VTH1.

When the voltage-to-current circuit 105 is activated or enabled, the voltage-to-current circuit 105 is arranged for generating a control signal PD with a low voltage level to turn off the transistors MA1-MA2 (N-type transistors) and turn on the switching transistors SW1-SW2. The control terminal of working transistor N1 is coupled to the input voltage signal VCTRL to receive the input voltage signal VCTRL and is disconnected to the ground level. The first terminal of working transistor N1, e.g. its source terminal, is coupled to the ground level via the resistor R1. The input voltage signal VCTRL is used for determining a conductance of the working transistor N1 to generate an output at the second terminal of working transistor N1, i.e. its drain terminal. The source terminal of transistor P1 of the current mirror circuit is coupled to the output of working transistor N1, and the output current signal is mapped and generated at the source terminal of transistor P2 and is provided for the current-controlled oscillator 110.

Figure 1B:
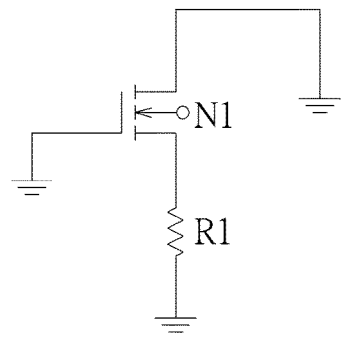
FIG. 1B is an equivalent circuit diagram of transistors of a current mirror circuit of the voltage-to-current circuit of FIG. 1A when the transistors of the current mirror circuit are turned off.

When the voltage-to-current circuit 105 is disabled, the voltage-to-current circuit 105 is arranged for controlling the control signal PD at a high voltage level, to turn on the first transistors MA1 and MA2 so that the transistors MA1 and MA2 are conducted, and to turn off the switching transistors SW1-SW2 to disconnect the connection between the working transistor N1 and current mirror circuit and to disconnect the connection between current-controlled oscillator 110 and current mirror circuit. The gate control terminal of working transistor N1 is connected to the ground level wherein its source terminal is coupled to the ground level via the resistor R1 and its drain terminal is connected to the ground level, as shown in FIG. 1B. Thus, for the transistor N1 implemented by the low power manufacturing process, when the transistor N1 is turned off, its control terminal (gate) and drain terminal are connected to the same ground level. Accordingly, no leakage currents or substantially only smaller and ignorable leakage currents will occur. In other words, the equivalent characteristics of the transistor N1 corresponds to the low leakage manufacturing process if the transistor N1 is turned off, and the equivalent characteristics of the transistor N1 corresponds to the low power manufacturing process if the transistor N1 is turned on.

Figure 2A:
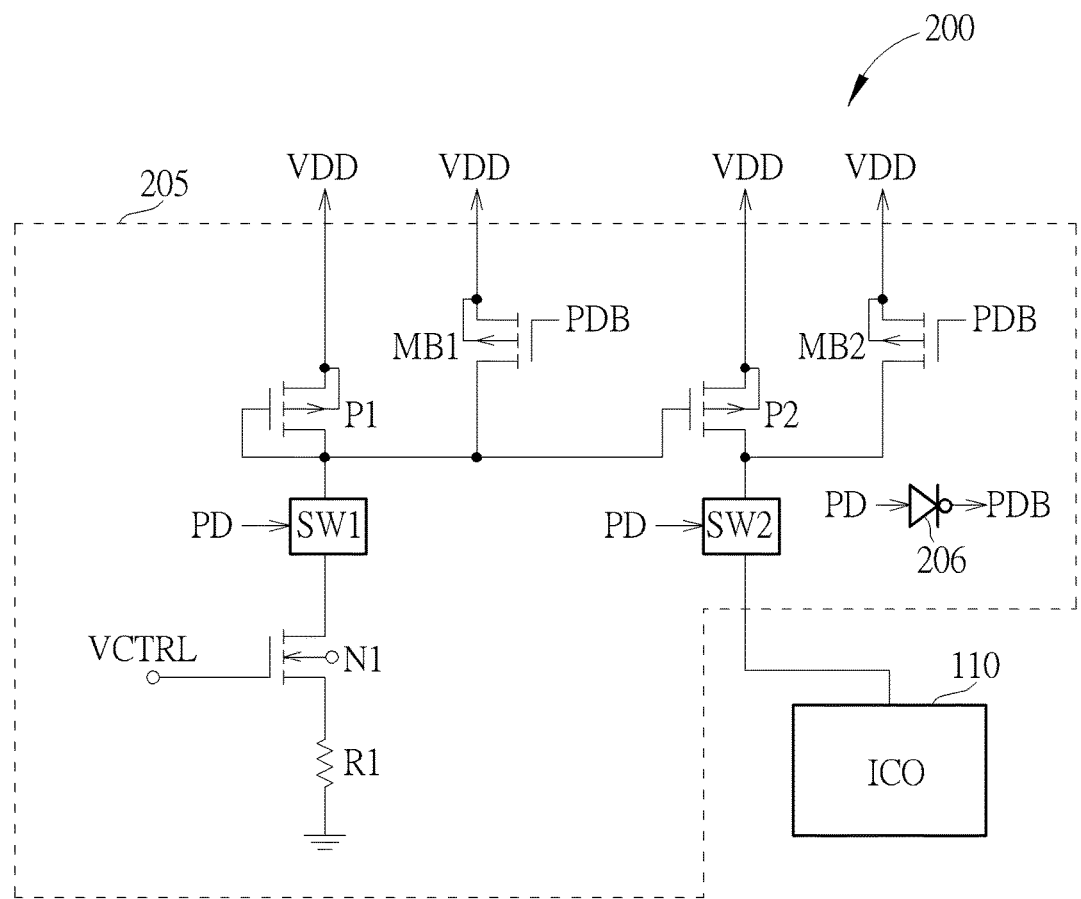
FIG. 2A is a diagram of a voltage-to-current circuit of a voltage-controlled oscillator apparatus according to a second embodiment of the invention.
Figure 2B:
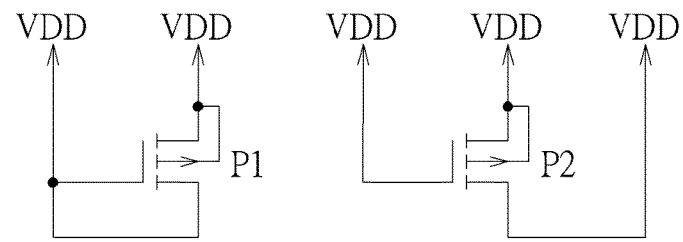
FIG. 2B is an equivalent circuit diagram of transistors of a current mirror circuit of the voltage-to-current circuit of FIG. 2A when the transistors of the current mirror circuit are turned off.

Additionally, the above-mentioned operation, using low leakage manufacturing process(es) transistor to avoid or alleviate the leakages of a low power manufacturing process, can be applied for transistor(s) of the current mirror circuit. Refer to FIG. 2A and FIG. 2B. FIG. 2A is a diagram of a voltage-to-current circuit 205 of a voltage-controlled oscillator apparatus 200 according to a second embodiment of the invention. FIG. 2B is an equivalent circuit diagram of transistors of a current mirror circuit of the voltage-to-current circuit 205 of FIG. 2A when the transistors of the current mirror circuit are turned off.

The voltage-controlled oscillator apparatus 200 comprises the voltage-to-current circuit 205 and the current-controlled oscillator 110. The voltage-to-current circuit 205 comprises switching transistor SW1-SW2, working transistor N1, the current mirror circuit including a pair of transistors P1-P2 at least, at least one of second transistors MB1 and MB2, and the resistor R1. The voltage-to-current circuit 205 is configured for generating an output current signal and outputting the output current signal to the current-controlled oscillator 110 according to an input voltage signal VCTRL. The output current signal passes through the switching transistor SW2 to the current-controlled oscillator 110, and thus the current-controlled oscillator 110 generates and outputs an oscillation frequency signal.

The supply voltage level VDD is a low voltage level such as one Volt. Different transistors within the voltage-to-current circuit 105 are implemented by adopting different manufacturing processes to obtain a wider operating voltage range when the voltage-to-current circuit 205 is operated under the condition of low supply voltage level and also to avoid the transistors enter an undesired operating region. For example, this can avoid a MOS transistor enter a linear operating region. The working transistor N1 and the transistors P1-P2 of the current mirror circuit are implemented by using transistor elements of a low power manufacturing process and correspond to the first threshold voltage VTH1 which is a lower threshold voltage. The switching transistors SW1-SW2 and the at least one of second transistors MB1 and MB2 are adopted for avoiding or alleviating leakage current(s) of transistors when the voltage-to-current circuit 105 is disabled, and are implemented by using transistors of a low leakage manufacturing process and correspond to the second threshold voltage VTH2 which is higher than the first threshold voltage VTH1.

When the voltage-to-current circuit 205 is activated or enabled, the voltage-to-current circuit 205 is arranged for generating a control signal PD and a control signal PDB wherein the control signal PDB is generated at the output of inverter 206 within the voltage-to-current circuit 205 in response to that the control signal PD received at the input of the inverter 206. In this situation, the control signal PD is at a low voltage level while the control signal PDB is at a high voltage level, so as to turn off the second transistors MB1 and MB2 and turn on the switching transistors SW1-SW2. The control terminal of working transistor N1 is coupled to the input voltage signal VCTRL to receive the input voltage signal VCTRL. The first terminal of working transistor N1, i.e. its source terminal as shown in FIG. 2A, is coupled to the ground level via the resistor R1. The input voltage signal VCTRL is used for determining the conductance of working transistor N1 to generate an output at the second terminal of working transistor N1, i.e. its drain terminal. The source terminal of transistor P1 of the current mirror circuit is coupled to the output of working transistor N1, and the output current signal is mirrored and generated at the source terminal of transistor P2 and is outputted to the current-controlled oscillator 110.

When the voltage-to-current circuit 205 is disabled, the control signal PD is controlled at the high voltage level while the control signal PDB is at the low voltage level correspondingly. According to the control signals PD and PDB, the voltage-to-current circuit 205 is arranged to turn on the second transistors MB1 and MB2 and to turn off the switching transistors SW1-SW2. As shown in FIG. 2B, the four terminals (gate, source, drain, and base) of transistor P1 is connected to the supply voltage level VDD, and also the four terminals (gate, source, drain, and base) of transistor P2 is connected to the supply voltage level VDD. Accordingly, no leakage currents or equivalently only smaller and ignorable leakage currents will occur when the transistors P1 and P2 are turned off even though the transistors P1-P2 are implemented by adopting the low power manufacturing process. In other words, the equivalent characteristics of the transistors P1 and P2 in this embodiment correspond to the low leakage manufacturing process if the transistors P1 and P2 are turned off, and the equivalent characteristics of the transistors P1 and P2 correspond to the low power manufacturing process when the transistors P1 and P2 are turned on.

It should be noted that in another embodiment merely the second transistor MB1 is necessary for avoiding or alleviating the leakage currents generated due to that the transistor P1 is turned off. The second transistors MB1 and MB2 are necessary for avoiding or alleviating the leakage currents generated due to that when the transistor P2 is turned off. In other words, to avoid or alleviate the leakage currents when turning off one transistor within the current mirror circuit, it may adopt single one second transistor or two second transistors for implementation. In addition, the first transistor is used for connecting a terminal of N-type transistor of the low power manufacturing process to the ground level, and the second transistor is used for connecting a terminal of P-type transistor of the low power manufacturing process to the supply voltage level VDD.

Figure 3:
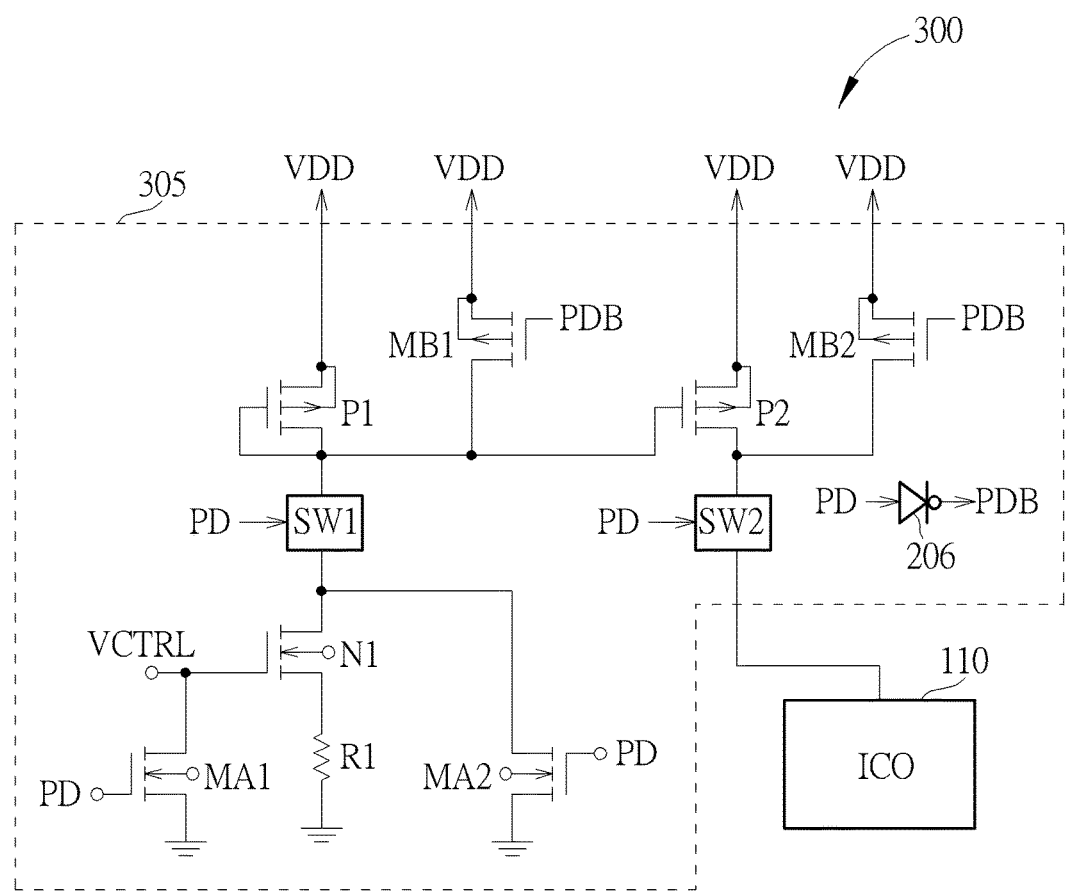
FIG. 3 is a circuit diagram of a voltage-to-current circuit of a voltage-controlled oscillator apparatus according to a third embodiment of the invention.

Furthermore, in other embodiments, the above-mentioned first transistors MA1-MA2 and second transistors MB1-MB2 can be implemented within the same voltage-to-current circuit, to avoid or alleviate the leakage currents generated due to turning off the transistors N1, P1, and P2. Detail circuit connections are shown on FIG. 3. FIG. 3 is a circuit diagram of a voltage-to-current circuit 305 of a voltage-controlled oscillator apparatus 300 according to a third embodiment of the invention.

Figure 4A:
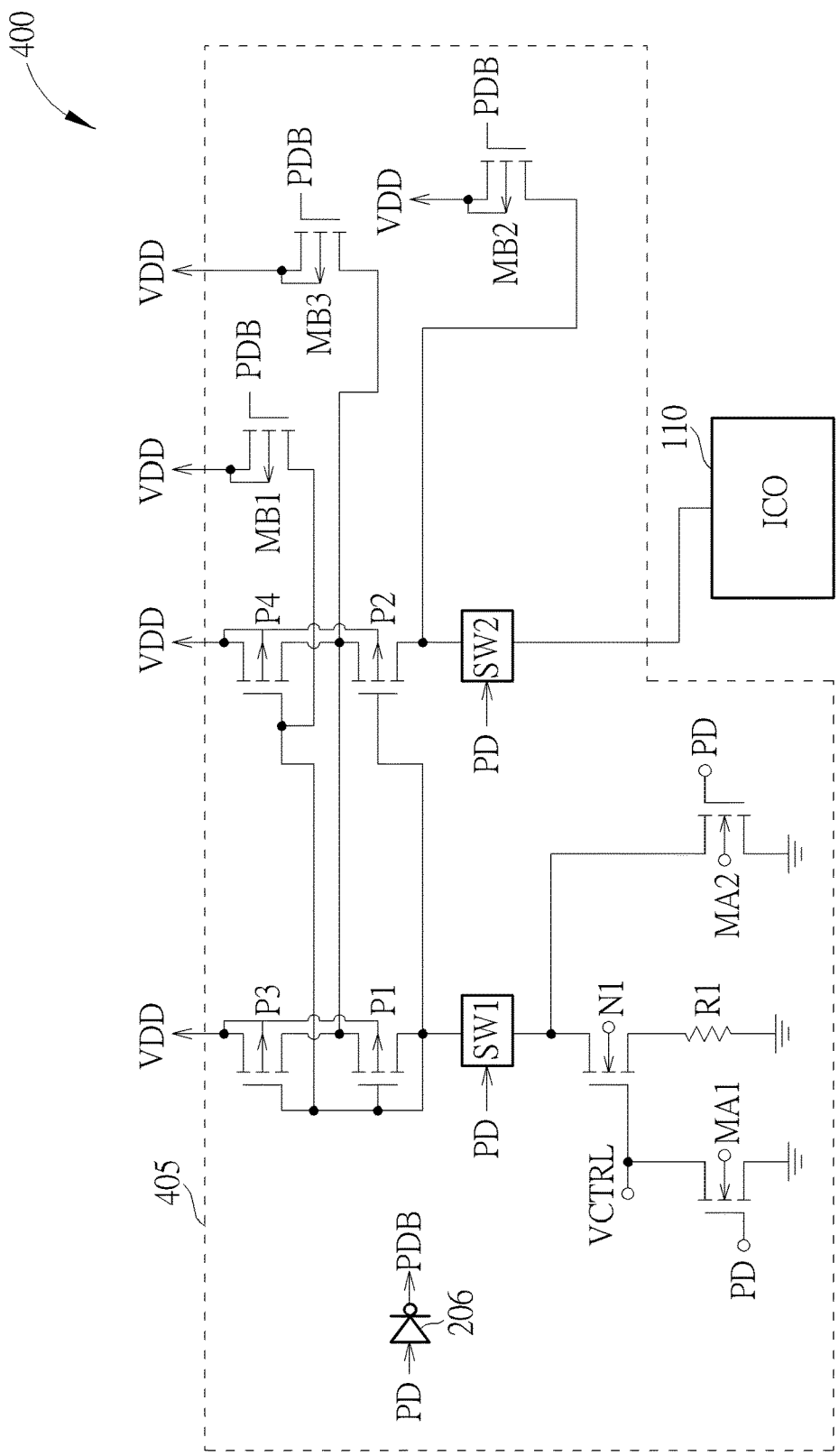
FIG. 4A is a circuit diagram of a voltage-to-current circuit of a voltage-controlled oscillator apparatus according to a fourth embodiment of the invention.

Furthermore, the above-mentioned mechanism and circuit design are also suitable for a current mirror circuit which is implemented by adopting a cascade current mirror. Refer to FIG. 4A and FIG. 4B. FIG. 4A is a circuit diagram of a voltage-to-current circuit 405 of a voltage-controlled oscillator apparatus 400 according to a fourth embodiment of the invention. FIG. 4B is an equivalent circuit diagram of the voltage-to-current circuit 405 as shown in FIG. 4A when turning off each low power manufacturing process transistor.

The voltage-controlled oscillator apparatus 400 comprises a voltage-to-current circuit 405 and the current-controlled oscillator 110. The voltage-to-current circuit 405 comprises switching transistors SW1-SW2, working transistor N1, a cascode current mirror circuit including a pair of transistors P1-P2 and another pair of transistors P3-P4, at least one of first transistors MA1 and MA2, at least one of second transistors MB1, MB2, MB3, and the resistor R1. The voltage-to-current circuit 405 is used for generating the output current signal to the current-controlled oscillator 110 according to the input voltage signal VCTRL. The output current signal passes through the switching transistor SW2 to the current-controlled oscillator 110 so that the current-controlled oscillator 110 generates and outputs an oscillation frequency signal. The pair of transistors P1-P2 in the cascade current mirror circuit are connected to the switching transistors SW1-SW2, and the pair of transistors P3-P4 are cascaded connected to the transistors P1-P2 to connect to the supply voltage level VDD.

The supply voltage level VDD is a low voltage level such as one Volt. Different transistors within the voltage-to-current circuit 405 are implemented by adopting different manufacturing processes to obtain a wider operating voltage range when the voltage-to-current circuit 405 is operated under the condition of low supply voltage level and also to avoid the transistors enter an undesired operating region. For example, this can avoid a MOS transistor enter a linear operating region. The working transistor N1 and the transistors P1, P2, P3, P4 of the current mirror circuit are implemented by using transistors of a low power manufacturing process and correspond to the first threshold voltage VTH1 which is a lower threshold voltage. The switching transistors SW1-SW2 and transistors MA1, MA2, MB1, MB2, MB3 are adopted for avoiding or alleviating leakage current(s) of transistors when the voltage-to-current circuit 405 is disabled, and are implemented by using transistors of a low leakage manufacturing process and correspond to the second threshold voltage VTH2 which is higher than the first threshold voltage VTH1.

When the voltage-to-current circuit 405 is activated or enabled, the voltage-to-current circuit 405 is arranged for generating a control signal PD and a control signal PDB wherein the control signal PDB is generated at the output of inverter 206 within the voltage-to-current circuit 405 in response to that the control signal PD received at the input of the inverter 206. In this situation, the control signal PD is at a low voltage level while the control signal PDB is at a high voltage level, so as to turn off the second transistors MB1, MB2, MB3 (P-type transistors) and turn on the switching transistors SW1-SW2. The control terminal of working transistor N1 is coupled to the input voltage signal VCTRL to receive the input voltage signal VCTRL and is disconnected to the ground level. The first terminal of working transistor N1, i.e. its source terminal as shown in FIG. 4A, is coupled to the ground level via the resistor R1. The input voltage signal VCTRL determines the conductance of working transistor N1 so that an output is generated at the second terminal of working transistor N1, i.e. its drain terminal as shown in FIG. 4A.

In addition, for the current mirror circuit composed by the transistors P1-P4, the pair of transistors P3-P4 and another pair of transistors P1-P2 form a cascode circuit structure. The transistors P1 and P3 are common base transistors and connected to the supply voltage level VDD. The gates of transistors P1, P2, P3, P4 are mutually connected to the same potential level. The source terminal of transistor P1 is coupled to the output of working transistor N1 via the switching transistor SW1, and the drain terminal of transistor P1 is coupled to the source terminal of transistor P3 and connected to the drain terminal of transistor P2 and the source terminal of transistor P4. The output current signal is mirrored and generated at the source terminal of transistor P2 and transmitted to the current-controlled oscillator 110. In addition, the second transistor MB1 is connected to the gates of transistors P1, P2, P3, P4, and the second transistor MB2 is connected to the source of transistor P2. The second transistor MB3 is connected between the transistors P1 and P3 and between the transistors P2 and P4 wherein the transistor MB3 is connected to the drain terminal of transistor P1, the source terminal of transistor P3, the drain terminal of transistor P2, and the source terminal of transistor P4.

When the voltage-to-current circuit 405 is disabled or deactivated, the control signal PD is at a high voltage level, and the control signal PDB is at a low voltage level correspondingly. The voltage-to-current circuit 405 is arranged to turn on the second transistors MB1, MB2, MB3, turn on the first transistors MA1, MA2, and to turn off the switching transistors SW1, SW2. Accordingly, as shown in FIG. 4B, the four terminals (gate, source, drain, and base) of each of transistors P1, P3 are all connected to the supply voltage level VDD, and the four terminals (gate, source, drain, and base) of each of transistors P2, P4 are also all connected to the supply voltage level VDD. This achieves that no leakage currents or substantially only smaller and ignorable leakage currents will occur when the transistors P1, P2, P3, P4 are turned off or disabled even though these transistors are implemented by adopting the low power manufacturing process. In other words, the equivalent characteristics of transistors P1, P2, P3, P4 if disabled correspond to the low leakage manufacturing process, and the equivalent characteristics of transistors P1, P2, P3, P4 if enabled correspond to the low power manufacturing process.

It should be noted that only the second transistors MB1 and MB3 are necessary for avoiding or alleviating the leakage currents generated due to that the transistors P1, P3, P4 are disabled. In addition, the second transistors MB1, MB2, MB3 are necessary for avoiding or alleviating the leakage currents generated due to that the transistor P2 is disabled. However, this is not meant to be a limitation of the invention. The above mentioned cascade circuit structure are merely used for illustrating one of the embodiments. The number of transistor circuit element(s) implemented by adopting the low leakage manufacturing process is determined by the actual circuit structure. That is, in one embodiment, by adopting one or at least one second transistor, the leakage currents generated due to disabling a certain low power manufacturing process transistor can be avoided or alleviated. The mechanism provided by the invention is arranged to adopt at least one low leakage manufacturing process transistor as a switch for avoiding or alleviating the leakage currents generated due to disabling at least one low power manufacturing process transistor. Modifications based on the above mechanism provided by the invention fall within the scope of the invention.

Figure 5A:
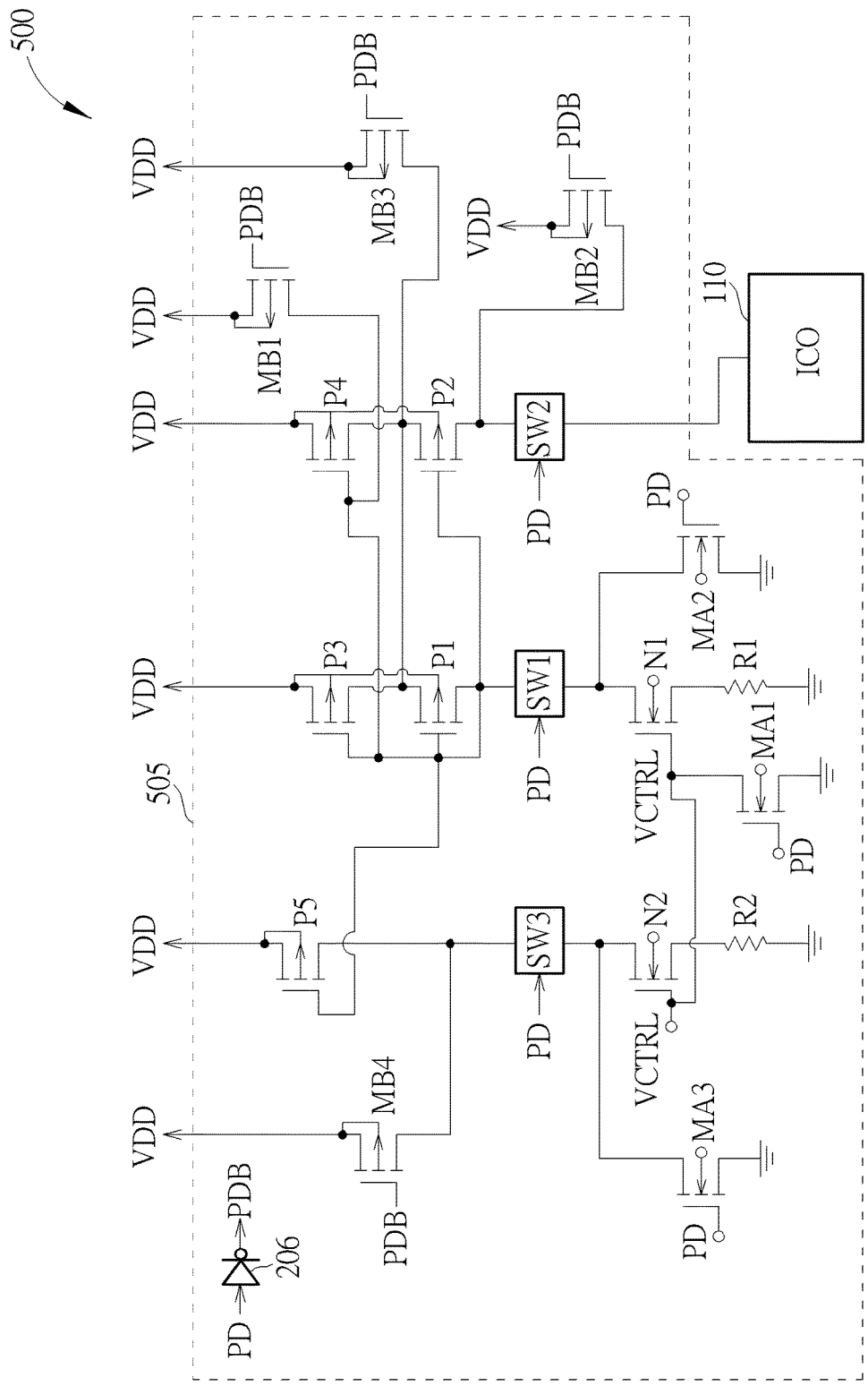
FIG. 5A is a diagram of a voltage-to-current circuit of a voltage-controlled oscillator apparatus according to the fifth embodiment of the invention.
Figure 5B:
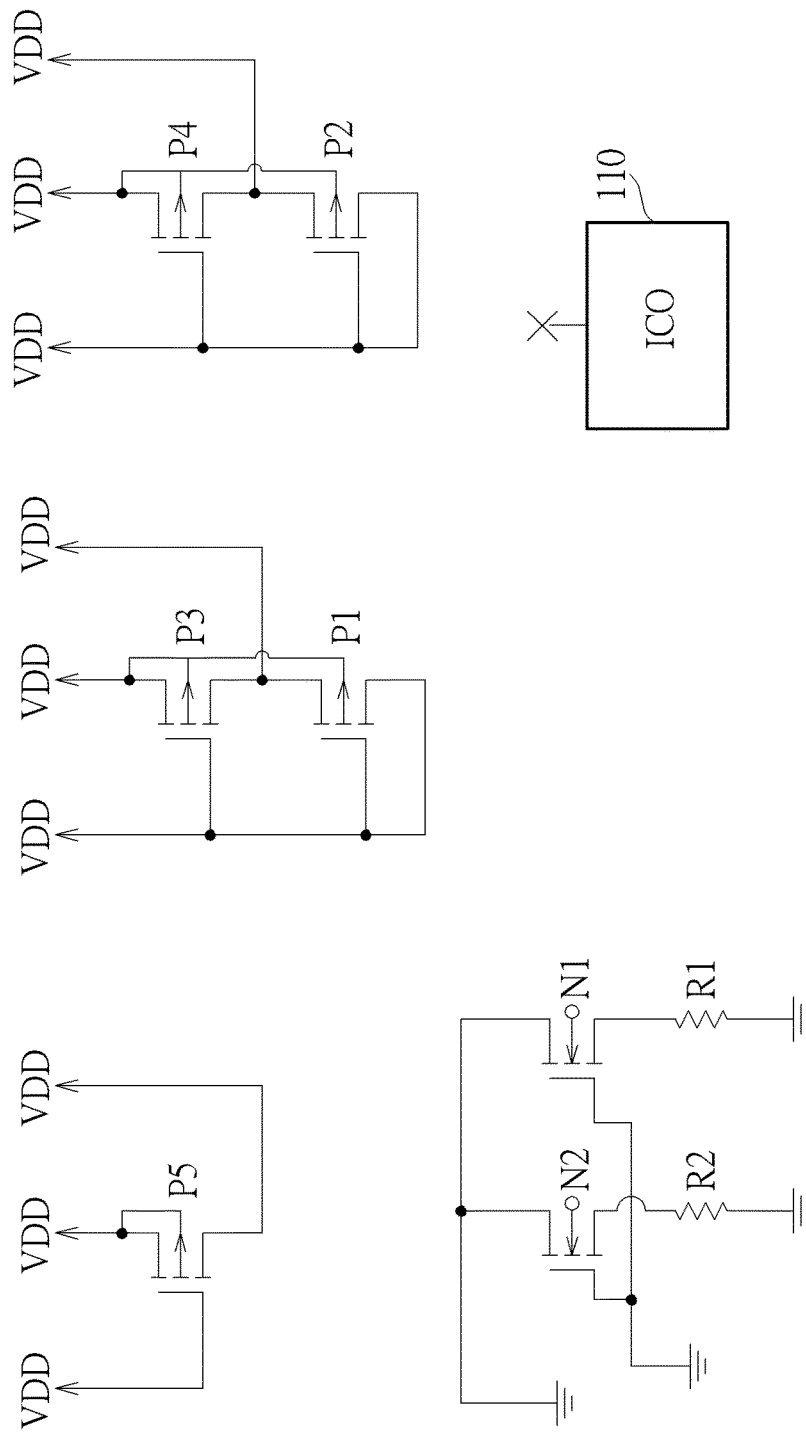
FIG. 5B is an equivalent circuit diagram of each low power manufacturing process transistor when the voltage-to-current circuit of FIG. 5A is disabled.

Furthermore, in one embodiment, the above-mentioned voltage-to-current circuits may further comprise another way of circuit for providing a bias current. Refer to FIG. 5A and FIG. 5B. FIG. 5A is a diagram of a voltage-to-current circuit 505 of a voltage-controlled oscillator apparatus 500 according to the fifth embodiment of the invention. FIG. 5B is an equivalent circuit diagram of each low power manufacturing process transistor when the voltage-to-current circuit 505 of FIG. 5A is disabled.

The voltage-controlled oscillator apparatus 500 comprises a voltage-to-current circuit 505 and the current-controlled oscillator 110. The voltage-to-current circuit 505 comprises switching transistors SW1-SW3, working transistors N1-N2, cascode current mirror circuit including the pair of transistors P1, P2 and the pair of transistors P3, P4, at least one of first transistors MA1, MA2, MA3, at least one of second transistors MB1-MB4, and the resistor R1. The voltage-to-current circuit 505 is used for generating the output current signal to the current-controlled oscillator 110 according to the input voltage signal VCTRL, and the output current signal passes through the switching transistor SW2 to the current-controlled oscillator 110 so that the current-controlled oscillator 110 generates and outputs an oscillation frequency signal.

The supply voltage level VDD is a low voltage level such as one Volt. Different transistors within the voltage-to-current circuit 505 are implemented by adopting different manufacturing processes to obtain a wider operating voltage range when the voltage-to-current circuit 505 is operated under the condition of low supply voltage level and also to avoid the transistors enter an undesired operating region. For example, this can avoid a MOS transistor enter a linear operating region. The working transistor N1, N2 and the transistors P1, P2, P3, P4, P5 of the current mirror circuit are implemented by using transistors of a low power manufacturing process and correspond to the first threshold voltage VTH1 which is a lower threshold voltage. The switching transistors SW1, SW2, SW3 and transistors MB1, MB2, MB3, MB4, MA1, MA2, MA3 are adopted for avoiding or alleviating leakage current(s) of transistors when the voltage-to-current circuit 505 is disabled, and are implemented by using transistors of a low leakage manufacturing process and correspond to the second threshold voltage VTH2 which is higher than the first threshold voltage VTH1.

When the voltage-to-current circuit 505 is enabled or activated, the voltage-to-current circuit 505 is arranged to generate the control signals PD and PDB wherein the control signal PDB is generated by transmitting the control signal PD to the inverter 206 within the voltage-to-current circuit 505. In this situation, the control signal PD is at a low voltage level, and the control signal PDB is correspondingly at a high voltage level. The second transistors MB1, MB2, MB3, MB4 are P-type transistors and are turned off in response to the high potential level of control signal PDB. The first transistors MA1, MA2, MA3 are N-type transistors and are turned off in response to the low potential level of control signal PD. The switching transistors SW1, SW2, SW3 are turned on. The control terminals (gates) of working transistors N1, N2 are respectively coupled to the input voltage signal VCTRL to receive the input voltage signal VCTRL and are disconnected to the ground level. The source terminals of working transistor N1, N2 are coupled to the ground level respectively via the resistors R1, R2. The input voltage signal VCTRL determines the conductance of working transistors N1, N2, and signal outputs are generated at the drain terminals of working transistors N1, N2. The transistor P5 is used as a biasing current circuit element, and is used with the resistor R2 and working transistor N2 to provide a bias current. The operations of other circuit elements have been detailed in previous paragraphs and are not detailed for brevity.

When the voltage-to-current circuit 505 is disabled or deactivated, the control signal PD is at a high voltage level, and the control signal PDB is correspondingly at a low voltage level. The voltage-to-current circuit 505 is arranged to turn on the second transistors MB1, MB2, MB3, MB4, turn on the first transistors MA1, MA2, MA3, and turn off the switching transistors SW1, SW2, SW3. Accordingly, as shown in FIG. 5B, the four terminals (gate, source, drain, and base) of each of the transistors P1, P3 are all connected to the supply voltage level VDD, and the four terminals (gate, source, drain, and base) of each of the transistors P2, P4 are also all connected to the supply voltage level VDD. The four terminals (gate, source, drain, and base) of transistor P5 are also connected to the supply voltage level VDD. The gates and drains of working transistors N1, N2 are connected to the ground level, and the sources of working transistors N1, N2 are connected to the ground level respectively via the resistors R1, R2. This achieves that no leakage currents or merely smaller and ignorable leakage currents occur when the transistors P1-P5 and N1-N2 are turned off even though these transistors are implemented by adopting the low power manufacturing process. In other words, the equivalent characteristics of transistors P1-P5 and N1-N2 if turned off correspond to the low leakage manufacturing process while the equivalent characteristics of transistors P1-P5 and N1-N2 if turned on correspond to the low power manufacturing process.

To summarize, the mechanism provided by the invention is to adopt/use at least one low leakage manufacturing processor transistor to connect at least one non-control terminal (source, drain, or base) and/or a control terminal (gate) of a low power manufacturing process transistor to a predetermined level such as the ground level or supply voltage level VDD when the power manufacturing process transistor is turned off, so as to connect at least two terminals of the low power manufacturing process transistor to the same potential level thereby avoiding or alleviating the leakage currents generated due to that the low power manufacturing process transistor is turned off.

For the transistor N1, the first transistors MA1 and MA2 are utilized for connecting the gate and drain of the transistor N1 to the ground level. For the transistor P1, the second transistor MB1 is utilized for connecting the gate, source, base, and drain of transistor P1 to the supply voltage level VDD. For the transistor P2, the second transistors MB1 and MB2 are utilized for connecting the gate, source, base, and drain of transistor P2 to the supply voltage level VDD. For the transistor P3 or P4, the second transistors MB1 and MB3 are utilized for connecting the gate, source, base, and drain of transistor P3 or P4 to the supply voltage level VDD. The connections of other transistors are shown in corresponding figures.

The above-mentioned voltage-to-current circuits can be still implemented by adopting cascode transistor circuit structure even operating at the condition of low supply voltage level, provide the advantage of wider operation voltage range, and avoid or alleviate the leakage currents generated due to disabling low power manufacturing process transistor(s) to significantly reduce power consumption. Additionally, in practice, it merely requires low cost to implement transistor(s) by adopting the low leakage manufacturing process. Thus, in preferred embodiments, multiple low leakage manufacturing process transistors can be utilized to avoid or alleviate leakage currents generated due to disabling each low power manufacturing process transistor if turned off. It should be noted that using only one or more low leakage manufacturing process transistor(s) to avoid or alleviate the leakage currents generated due to a particular low power manufacturing process transistor when turned off should also fall within the scope of the invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage-to-current circuit for converting an input voltage signal to an output current signal in proportion and outputting the output current signal to a current control oscillator, the voltage-to-current circuit comprising:
   a switching transistor, being turned on when the voltage-to-current circuit is activated;
   a working transistor, having a control terminal, a first terminal, and a second terminal, the control terminal being coupled to the input voltage signal to receive the input voltage signal, the first terminal being coupled to a ground level, the second terminal being coupled to one terminal of the switching transistor, the input voltage signal determining a conductance of the working transistor and being used for generating an output at the second terminal of the working transistor;
   a current mirror circuit, at least including a pair of transistors, coupled to a supply voltage level and another terminal of the switching transistor, configured for generating the output current signal according to the output at the second terminal of the working transistor; and
   at least two low leakage manufacturing process transistors, coupled to the control terminal and the second terminal of the working transistor;
   wherein, the working transistor and the current mirror circuit correspond to a first threshold voltage of a low power manufacturing process, the switching transistor and the at least two low leakage manufacturing process transistors correspond to a second threshold voltage of a low leakage manufacturing process, the second threshold voltage being higher than the first threshold voltage; and, when the voltage-to-current circuit is disabled, the switching transistor is turned off to become open, and the at least two low leakage manufacturing process transistors are turned on, to make the control terminal and the second terminal of the working transistor be coupled to the ground level.

2. The voltage-to-current circuit of claim 1, further comprising:
   at least one second transistor, coupled to at least one non-control terminal of at least one of the pair of transistors of the current mirror circuit, corresponding to the second threshold voltage of the low leakage manufacturing process;
   wherein when the voltage-to-current circuit is disabled, the at least one second transistor is turned on, to make a plurality of non-control terminals of at least one of the pair of transistors of the current mirror circuit be coupled to the supply voltage level.

3. The voltage-to-current circuit of claim 2, wherein the current mirror circuit is a cascode current mirror, the at least one second transistor comprises at least one set of second transistors, the cascode current mirror comprises:
a first pair of transistors, connected to the switching transistor; and
a second pair of transistors, cascode-connected to the first pair of transistors to connect the supply voltage level;
wherein when the voltage-to-current circuit is disabled, the at least one set of second transistors are turned on, to make a plurality of control terminals and a plurality of non-control terminals of the first pair of transistors and the second pair of transistors within the current mirror circuit are connected to the supply voltage level.

4. The voltage-to-current circuit of claim 1, further comprising:
another switching transistor, being turned on when the voltage-to-current circuit is activated;
another working transistor, having a control terminal, a first terminal, and a second terminal, the control terminal being coupled to the input voltage signal, the first terminal being coupled to the ground level, the second terminal being coupled to one terminal of the another switching transistor;
a biasing current circuit element, coupled to another terminal of the another switching transistor, configured for providing a bias current;
wherein that at least two low leakage manufacturing process transistors comprises a set of first transistors connected to the control terminal and the second terminal of the working transistor and connected to the control terminal and the second terminal of the another working transistor; the another working transistor corresponds to the first threshold voltage of the low power manufacturing process, and the another switching transistor corresponds to the second threshold voltage of the low leakage manufacturing process; and, when the voltage-to-current circuit is disabled, the another switching transistor is turned off to be open, and the set of first transistors are turned on, to make the control terminal and the second terminal of the another working transistor be coupled to the ground level.

5. The voltage-to-current circuit of claim 1, further comprising:
at least one second transistor, coupled to one transistor of the biasing current circuit element and the another terminal of the another switching transistor;
wherein the biasing current circuit element corresponds to the first threshold voltage of the low power manufacturing process, and the at least one second transistor corresponds to the second threshold voltage of the low leakage manufacturing process; when the voltage-to-current circuit is disabled, the at least one second transistor is turned on, to make a non-control terminal of the transistor of the biasing current circuit element, coupled to the another switching transistor, be coupled to the supply voltage level.

6. A voltage-to-current circuit, for converting an input voltage signal into an output current signal in proportion and outputting the output current signal to a current controlled oscillator, the voltage-to-current circuit comprising:
a switching transistor, being turned on when the voltage-to-current circuit is activated;
a working transistor, having a control terminal, a first terminal, and a second terminal, the control terminal being coupled to the input voltage signal to receive the input voltage signal, the first terminal being coupled to a ground level, the second terminal being coupled to one terminal of the switching transistor, the input voltage signal determining a conductance of the working transistor and being used for generating an output at the second terminal of the working transistor;
a current mirror circuit, at least comprising a pair of transistors, the current mirror circuit being coupled to a supply voltage level and another terminal of the switching transistor, configured for generating the output current signal according to the output at the second terminal of the working transistor; and
at least one low leakage manufacturing process transistor, coupled to at least one non-control terminal of at least one of the pair of transistors of the current mirror circuit;
wherein, the working transistor and the current mirror circuit both correspond to a first threshold voltage of a low power manufacturing process, the switching transistor and the at least one low leakage manufacturing process transistor both correspond to a second threshold voltage of a low leakage manufacturing process, the second threshold voltage is higher than the first threshold voltage; and, when the voltage-to-current circuit is disabled, the switching transistor is turned off to be open, and the at least one low leakage manufacturing process transistor is turned on, to couple a plurality of non-control terminals of at least one of the pair of transistors of the current mirror circuit to the supply voltage level.

7. A voltage-controlled oscillator apparatus, comprising:
a current-controlled oscillator, configured for generating an output frequency signal according to a current signal; and
a voltage-to-current circuit, configured for converting an input voltage signal into a current signal in proportion and outputting the current signal to the current-controlled oscillator, the voltage-to-current circuit comprising:
a switching transistor, being turned on when the voltage-to-current circuit is enabled;
a working transistor, including a control terminal, a first terminal, and a second terminal, the control terminal being coupled to the input voltage signal to receive the input voltage signal, the first terminal being coupled to a ground level, the second terminal being coupled to one terminal of the switching transistor, the input voltage signal determining a conductance of the working transistor to generate an output at the second terminal of the working transistor;
a current mirror circuit, comprising a pair of transistors, the current mirror circuit being coupled to a supply voltage level and another terminal of the switching transistor and used for generating the output current signal according to the output at the second terminal of the working transistor; and
at least two low leakage manufacturing process transistors, coupled to the control terminal and the second terminal of the working transistor;
wherein, the working transistor and the current mirror circuit both correspond to a first threshold voltage of a low power manufacturing process, and the switching transistor and the at least two low leakage manufacturing process transistors both correspond to a second threshold voltage of a low leakage manufacturing process, the second threshold voltage is higher than the first threshold voltage; and, when the voltage-to-current circuit is disabled, the switching transistor is turned off to be open, and the at least two low leakage manufacturing process transistors are turned on, to couple the control terminal the second terminal of the working transistor to the ground level.

8. A voltage-controlled oscillator apparatus, comprising:
a current-controlled oscillator, configured for generating an output frequency signal according to a current signal; and
a voltage-to-current circuit, configured for converting an input voltage signal into a current signal in proportion and outputting the current signal to the current-controlled oscillator, the voltage-to-current circuit comprising:
  a switching transistor, being turned on when the voltage-to-current circuit is enabled;
  a working transistor, having a control terminal, a first terminal, and a second terminal, the control terminal being coupled to the input voltage signal to receive the input voltage signal, the first terminal being coupled to a ground level, the second terminal being coupled to a terminal of the switching transistor, the input voltage signal determining a conductance of the working transistor to generate an output at the second terminal of the working transistor;
  a current mirror circuit, comprising a pair of transistors, coupled to a supply voltage level and another terminal of the switching transistor, configured for generating the output current signal according to the output at the second terminal of the working transistor; and
  at least one low leakage manufacturing process transistor, coupled to at least one non-control terminal of at least one of the pair of transistors of the current mirror circuit;
wherein the working transistor and the current mirror circuit both correspond to a first threshold voltage of a low power manufacturing process, the switching transistor and the at least one low leakage manufacturing process transistor both correspond to a second threshold voltage of a low leakage manufacturing process, the second threshold voltage is higher than the first threshold voltage; and, when the voltage-to-current circuit is disabled, the switching transistor is turned off to be open, and the at least one low leakage manufacturing process transistor is turned on, to couple a plurality of non-control terminals of at least one of the pair of transistors of the current mirror circuit to the supply voltage level.

\* \* \* \* \*